US011327829B2

(12) United States Patent
Nakajima

(10) Patent No.: US 11,327,829 B2
(45) Date of Patent: May 10, 2022

(54) SEMICONDUCTOR DEVICE WHICH DETECTS OCCURRENCE OF AN ABNORMALITY DURING OPERATION BASED ON A COMPARISON OF AN INPUT SPECIFYING A PWM SIGNAL AND AN ESTIMATED INPUT OBTAINED FROM AN INVERSE OPERATION

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shigeru Nakajima, Zama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 9 days.

(21) Appl. No.: 16/561,126

(22) Filed: Sep. 5, 2019

(65) Prior Publication Data

US 2020/0285536 A1 Sep. 10, 2020

(30) Foreign Application Priority Data

Mar. 5, 2019 (JP) .............................. JP2019-039836

(51) Int. Cl.
G06F 11/22 (2006.01)
G06F 11/07 (2006.01)
(Continued)

(52) U.S. Cl.
CPC ...... *G06F 11/0796* (2013.01); *G06F 11/1641* (2013.01); *G01R 31/3167* (2013.01); *H03M 1/1095* (2013.01)

(58) Field of Classification Search
CPC ...... H03K 7/08; G11B 20/18; G11B 20/1806; G11B 20/1816; G11B 20/1823;
(Continued)

(56) References Cited

U.S. PATENT DOCUMENTS 6,670,904 B1 * 12/2003 Yakovlev .............. H03M 1/144
341/165
8,031,098 B1 * 10/2011 Ebner .................. H03M 1/1061
341/146
(Continued)

FOREIGN PATENT DOCUMENTS

DE 10007644 A1 * 8/2001 ............. G01D 5/246
JP 6050083 B2 12/2016

*Primary Examiner* — Joseph O Schell
(74) *Attorney, Agent, or Firm* — Holtz, Holtz & Volek PC

(57) ABSTRACT

A semiconductor device of an embodiment includes a main circuit configured to perform a predetermined operation to an input signal to output an output signal, an inverse operation circuit configured to receive the output signal of the main circuit as an input, and perform an inverse operation of the predetermined operation by using the output signal to output an inverse operation result signal, and a comparison circuit configured to compare the input signal and the inverse operation result signal, and output a predetermined signal when the input signal and the inverse operation result signal do not coincide with each other.

4 Claims, 4 Drawing Sheets

(51) Int. Cl.
*G06F 11/16* (2006.01)
*H03M 1/10* (2006.01)
*G01R 31/3167* (2006.01)

(58) Field of Classification Search
CPC ............ G11B 20/1869; G11B 20/1876; G01R 31/31727; G01R 31/2834; G01R 31/2832; G01R 31/316; G01R 31/3161; G01R 31/3163; G01R 31/3167; H02M 1/32; H02M 1/325; H02M 2001/0016; H02M 2001/0025; H03M 1/1071; H03M 1/1095
See application file for complete search history.

(56) References Cited

U.S. PATENT DOCUMENTS

| | | | |
|---|---|---|---|
| 9,329,927 B2 | 5/2016 | Ito | |
| 10,033,400 B1* | 7/2018 | Mallett | H03M 1/1071 |
| 2004/0008021 A1* | 1/2004 | Kranitzky | G01R 31/42 |
| | | | 324/85 |
| 2006/0279438 A1* | 12/2006 | Kishi | H04B 10/802 |
| | | | 341/51 |
| 2012/0235842 A1* | 9/2012 | Douzane | G05B 11/28 |
| | | | 341/120 |
| 2013/0020978 A1* | 1/2013 | Yamada | G06F 11/0754 |
| | | | 318/490 |
| 2014/0052390 A1* | 2/2014 | Kim | H05B 45/50 |
| | | | 702/58 |
| 2016/0041212 A1* | 2/2016 | Darbinyan | G01R 29/0273 |
| | | | 327/33 |
| 2017/0328953 A1* | 11/2017 | D'Angelo | H03K 19/007 |
| 2019/0285468 A1* | 9/2019 | Berkovich | G02B 27/0081 |

* cited by examiner

SEMICONDUCTOR DEVICE WHICH DETECTS OCCURRENCE OF AN ABNORMALITY DURING OPERATION BASED ON A COMPARISON OF AN INPUT SPECIFYING A PWM SIGNAL AND AN ESTIMATED INPUT OBTAINED FROM AN INVERSE OPERATION

CROSS-REFERENCE TO RELATED APPLICATIONS

This application is based upon and claims the benefit of priority from the prior Japanese Patent Application No. 2019-39836 filed in Japan on Mar. 5, 2019; the entire contents of which are incorporated herein by reference.

FIELD

Embodiments described herein relate generally to a semiconductor device.

BACKGROUND

In a semiconductor device having various functions, there is an art of securing functional safety. For example, there is a functionally safe semiconductor device which adopts a dual core lock step method (hereinafter, abbreviated as DCLS). The semiconductor device of a DCLS configuration has a main circuit configured to execute a predetermined function, a redundancy circuit of the same circuit configuration as the circuit configuration of the main circuit, and an output signal comparison circuit that compares an output signal of the main circuit and an output signal of the redundancy circuit are the same.

The output signal comparison circuit compares the output signal of the main circuit and the output signal of the redundancy circuit in each predetermined clock cycle, and when the comparison result is that the output signals do not coincide with each other, the output signal comparison circuit asserts an abnormality detection signal. Once the abnormality detection signal is asserted, the assert state is kept, and thereby occurrence of abnormality in execution of the function can be detected in an internal circuit or an external circuit of the semiconductor device.

However, the redundancy circuit has the same circuit configuration as the main circuit, and therefore, when a circuit scale of the main circuit increases, a circuit scale of the redundancy circuit similarly increases. As a result, the size of the semiconductor device also increases.

Further, for a common cause due to noise or the like, the two circuits of the main circuit and the redundancy circuit provide the same outputs, and therefore, reliability of execution of functions cannot be secured. Similarly, when there is a bug in operation programs of the circuits, the two circuits provide the same outputs, and therefore reliability of functional safety cannot be secured.

DETAILED DESCRIPTION

A semiconductor device of embodiments each includes an operation circuit configured to perform a predetermined operation to an input signal and output an output signal, an inverse operation circuit configured to receive the output signal as an input, perform an inverse operation of the predetermined operation by using the output signal to output an inverse operation result signal, and a comparison circuit configured to compare the input signal and the inverse operation result signal, and output a predetermined signal when the input signal and the inverse operation result signal do not coincide with each other.

Hereinafter, the embodiments will be described with reference to the drawings.

First Embodiment (Configuration)

Figure 1:
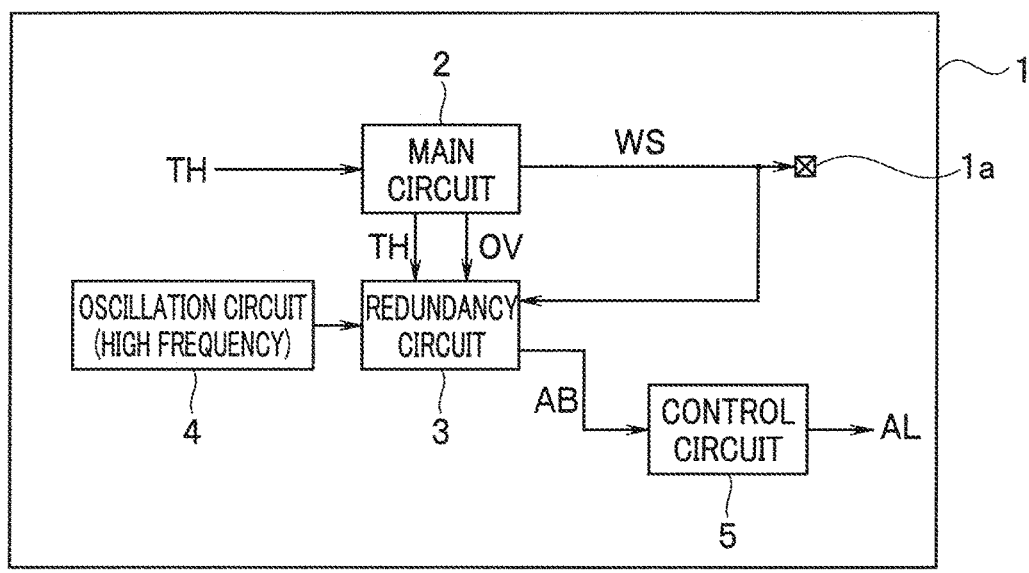
FIG. 1 is a block diagram illustrating a semiconductor device according to a first embodiment.

FIG. 1 is a block diagram of a semiconductor device according to the present embodiment. A semiconductor device 1 is capable of executing at least one function, and includes an operation circuit for the function. FIG. 1 illustrates only a main circuit 2 configured to execute one of a plurality of functions included in the semiconductor device 1. The main circuit 2 is an operation circuit configured to perform a predetermined operation to an input signal and output an output signal.

The semiconductor device 1 further includes a redundancy circuit 3 and an oscillation circuit 4. The redundancy circuit 3 monitors whether an operation of the main circuit 2 is correctly performed. The oscillation circuit 4 is a clock circuit configured to generate a clock signal of a higher frequency than an operation clock of the main circuit 2 and output the clock signal to the redundancy circuit 3.

Furthermore, the semiconductor device 1 has a control circuit 5. The control circuit 5 performs operation instructions of various circuits in the semiconductor device 1 and control of execution timings. Further, when the control circuit 5 receives from the redundancy circuit 3 an abnormal signal AB indicating that an abnormality is detected in execution of the function of the main circuit 2, the control circuit 5 outputs a predetermined alarm signal AL. In other words, the abnormal signal AB of the redundancy circuit 3 is supplied to the control circuit 5, and when the abnormal signal AB indicates an abnormality, the control circuit 5 outputs the predetermined alarm signal AL.

Figure 2:
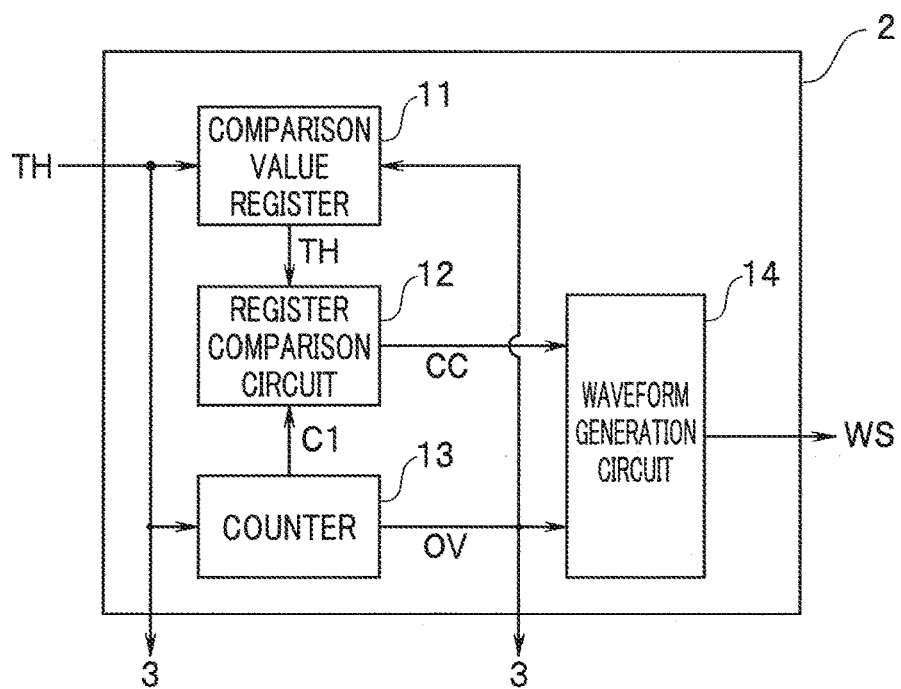
FIG. 2 is a block diagram illustrating a configuration of a main circuit according to the first embodiment.

For example, the main circuit 2 is a PWM control circuit configured to generate a PWM signal for driving a motor. The PWM signal is outputted from an output terminal 1a of the semiconductor device 1. FIG. 2 is a block diagram illustrating a configuration of the main circuit 2. The main circuit 2 includes a comparison value register 11, a register comparison circuit 12, a counter 13, and a waveform generation circuit 14.

The comparison value register 11 stores a plurality of comparison values TH that are supplied at predetermined timings from an external central processing unit (hereinafter, referred to as a CPU) which is not illustrated. The respective comparison values TH specify duty ratios of PWM waveforms in respective predetermined periods. The comparison value register 11 outputs the comparison values TH one by one in a predetermined order from the plurality of comparison values TH which are inputted.

The register comparison circuit 12 compares a count value C1 of the counter 13 and the comparison value TH of the comparison value register 11, and outputs a coincidence signal CC to the waveform generation circuit 14 when the comparison value TH and the count value C1 coincide with each other. The coincidence signal CC is asserted when the count value C1 and the comparison value TH coincide with each other.

The counter 13 is a circuit configured to start to count based on a clock signal from outside not illustrated when the counter 13 receives the comparison value TH, and to count up and output a count value. The counter 13 outputs the count value to the register comparison circuit 12, and when the counter 13 overflows, the counter 13 outputs an overflow signal OV to the comparison value register 11 and the waveform generation circuit 14.

As described above, the comparison value TH from the CPU is set in the comparison value register 11. When the overflow signal OV is asserted, the comparison value register 11 updates the value of the comparison value TH, and outputs the updated value to the register comparison circuit 12.

For example, the PWM signal for motor drive has a duty ratio of a PWM waveform changed at each predetermined period T. The CPU supplies to the comparison value register 11 the comparison values TH corresponding to the respective periods as thresholds. In other words, the CPU supplies to the comparison value register 11 the plurality of thresholds corresponding to the plurality of periods. When the comparison value register 11 receives the overflow signal OV indicating that the present period T ends, the comparison value register 11 updates the comparison value TH for the next period and outputs the updated comparison value TH to the register comparison circuit 12. When the overflow signal OV is asserted, the waveform generation circuit 14 outputs a waveform signal WS at a high level, and when the coincidence signal CC is asserted, the waveform generation circuit 14 outputs the waveform signal WS at a low level.

As illustrated in FIG. 1, the main circuit 2 executes at the predetermined period T a predetermined operation to the comparison value TH which is an input signal, and outputs the waveform signal WS which is the PWM signal for motor drive as an output signal, for example. In other words, the main circuit 2 receives a threshold signal as an input signal, and outputs the PWM signal as the output signal based on the threshold signal. The comparison value TH, the overflow signal OV and the waveform signal WS are supplied to the redundancy circuit 3 from the main circuit 2.

Figure 3:
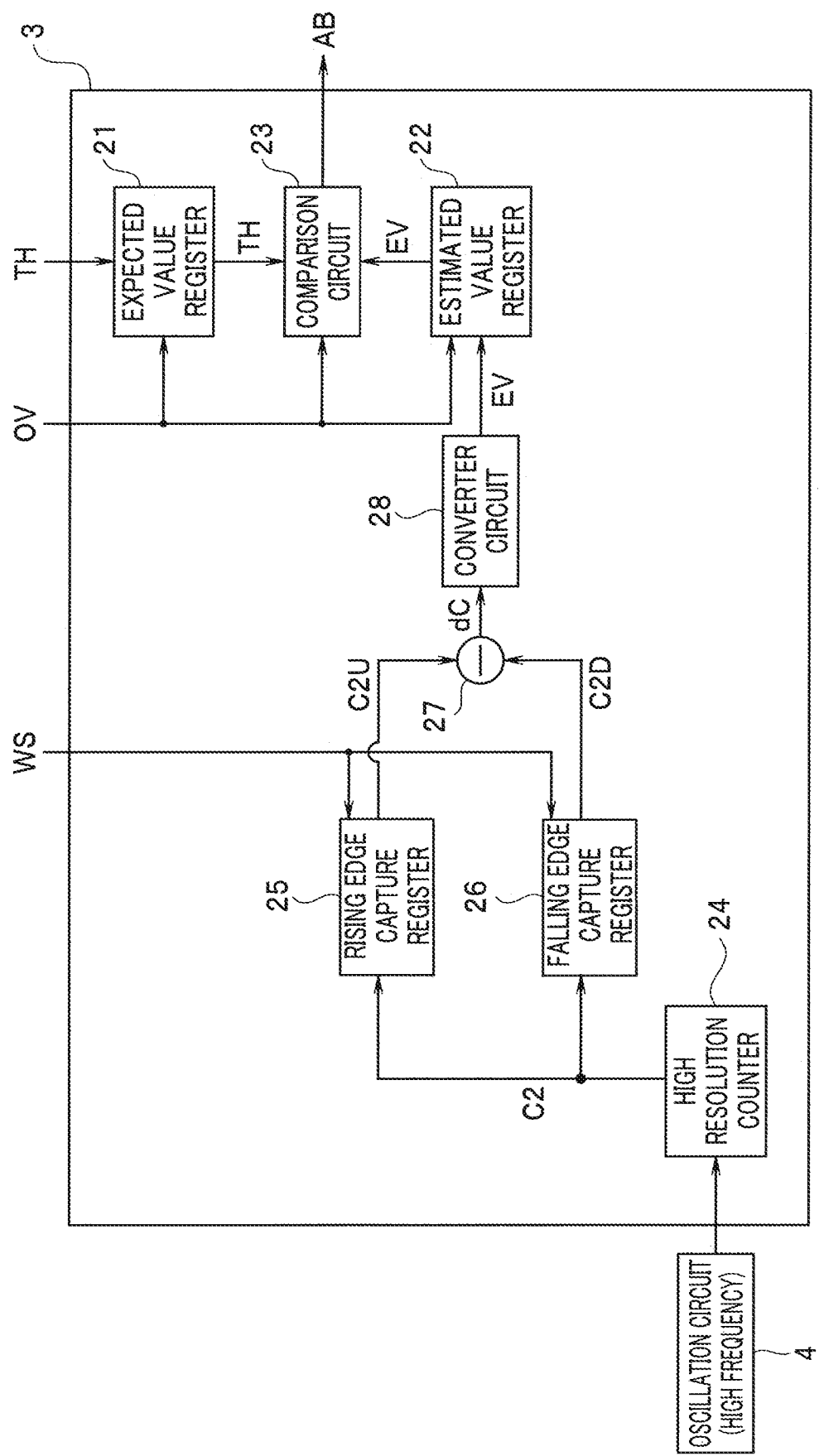
FIG. 3 is a block diagram illustrating a configuration of a redundancy circuit according to the first embodiment.

FIG. 3 is a block diagram illustrating a configuration of the redundancy circuit 3. The redundancy circuit 3 includes an expected value register 21, an estimated value register 22, a comparison circuit 23, a high resolution counter 24, a rising edge capture register 25, a falling edge capture register 26, a difference circuit 27 and a converter circuit 28.

The expected value register 21 stores the comparison value TH which is outputted from the comparison value register 11 from the main circuit 2. The expected value register 21 holds the comparison value TH of the comparison value register 11 of the main circuit 2 as an expected value, when the overflow signal OV is asserted. Therefore, the comparison value TH which is stored in the expected value register 21 is updated at each predetermined period T.

The estimated value register 22 is a register that stores an estimated value EV that will be described later. The comparison circuit 23 compares two values of the comparison value TH stored in the expected value register 21 and the estimated value EV stored in the estimated value register 22. The comparison circuit 23 compares the two values, with the overflow signal OV as a diagnosis timing signal. The comparison circuit 23 outputs the abnormal signal AB when the two values do not coincide with each other.

The high resolution counter 24 counts a count value C2 based on the clock signal from the external oscillation circuit 4. The external oscillation circuit 4 outputs a clock signal of a high frequency from which times of a rise timing and a fall timing of the signal from the main circuit 2 can be determined as will be described later. The high resolution counter 24 is a free run counter, and counts the count value C2 with a higher frequency than the operation frequency of the main circuit 2.

The rising edge capture register 25 includes a circuit configured to monitor a change of the waveform signal WS which is inputted, and detect a timing of rise of the waveform signal WS, and stores a count value C2U of the high resolution counter 24 in the detected rise timing as a rise time and outputs the count value C2U.

The falling edge capture register 26 includes a circuit configured to monitor a change of the waveform signal WS which is inputted, and detect a timing of fall of the waveform signal WS, and stores a count value C2D of the high resolution counter 24 in the detected fall timing as a fall time and outputs the count value C2D. Therefore, the rising edge capture register 25 and the falling edge capture register 26 respectively hold high resolution counter values at a time of the waveform signal WS rising.

The difference circuit 27 calculates a difference value dC between the count value of the rising edge capture register 25 and the count value of the falling edge capture register 26 and outputs the difference value dC. As will be described later, the converter circuit 28 calculates the estimated value EV from the difference value dC from the difference circuit 27 and outputs the estimated value EV. The estimate value EV is a value obtained by inversely operating the comparison value TH which is inputted to the waveform generation circuit 14 from the waveform signal WS which is outputted from the waveform generation circuit 14, and estimating the comparison value TH. The estimated value EV calculated by the converter circuit 28 is outputted to and stored in the estimated value register 22.

In other words, the rising edge capture register 25, the falling edge capture register 26, the difference circuit 27 and the converter circuit 28 configure an inverse operation circuit that performs inverse operation of a predetermined operation which is performed in the main circuit 2 and outputs an inverse operation result signal, by using the waveform signal WS, with the waveform signal WS which is the output signal of the main circuit 2 as an input.

The comparison circuit 23 compares the comparison value TH of the expected value register 21 and the estimated value EV of the estimated value register 22 when the overflow signal OV is asserted, and when the comparison value TH and the estimated value EV do not coincide with each other as a result of the comparison, the comparison circuit 23 outputs, that is, asserts the abnormal signal AB. In other words, the comparison circuit 23 compares the input signal and the inverse operation result signal, and when the input signal and the inverse operation result signal do not coincide with each other, the comparison circuit 23 outputs the abnormal signal AB as a predetermined signal.

As above, the main circuit 2 performs an operation of changing the output signal in response to the input signal, and the inverse operation circuit estimates an estimated value of the input signal based on the change of the output signal, and outputs the estimated value as the inverse operation result signal.

Note that the coincidence of the comparison value TH and the estimated value EV may also be determined according to whether or not the estimated value EV is within a predetermined range where the comparison value TH is a center. In that case, when the estimated value EV is outside the predetermined range where the comparison value TH is the center, the comparison circuit 23 outputs, that is, asserts the abnormal signal AB.

(Operation)

Figure 4:
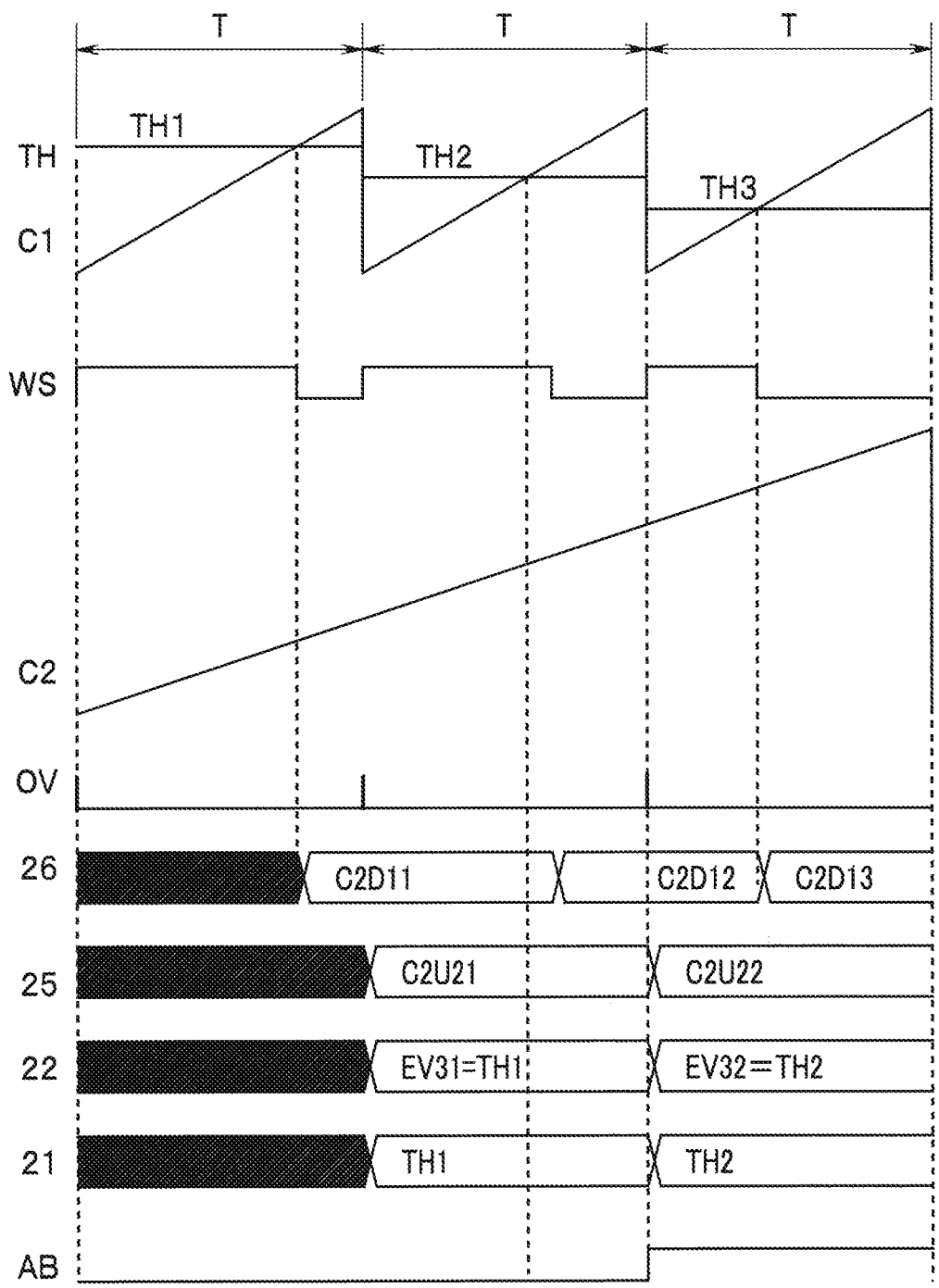
FIG. 4 is a timing chart of respective signals of the redundancy circuit according to the first embodiment.

An operation of the aforementioned redundancy circuit will be described. FIG. 4 is a timing chart of the respective signals of the redundancy circuit 3. As illustrated in FIG. 4, the count value C1 of the counter 13 is counted up at each predetermined period T. The counter 13 outputs the overflow signal OV at each predetermined period T. The comparison value TH from the CPU which is not illustrated is set at each predetermined period T. The high resolution counter 24 counts the count value C2 and outputs the count value C2, regardless of the predetermined period T.

The waveform generation circuit 14 of the main circuit 2 outputs the waveform signal WS at a low level when the count value C1 of the counter 13 coincides with the comparison value TH, at each predetermined period T. More specifically, the waveform generation circuit 14 outputs the waveform signal WS at a high level when the waveform generation circuit 14 receives the overflow signal OV, and outputs the waveform signal WS at a low level when the count value C1 of the counter 13 coincides with the comparison value TH. By being given the comparison value TH at each predetermined period T from the CPU, the main circuit 2 outputs the PWM signal which is a pulse signal, as the output signal.

As illustrated in FIG. 4, the rising edge capture register 25 holds the count value C2U of the rise timing of the waveform signal WS, and the falling edge capture register 26 holds the count value C2D of the fall timing of the waveform signal WS.

Here, an operation that is performed by the converter circuit 28 will be described. Duty ratios of the waveform signals WS in the respective periods are specified in accordance with the comparison value TH. As illustrated in FIG. 4, in response to increase and decrease of the inputted comparison value TH, a period in which the waveform signal WS is at the high level increases and decreases. The difference value dC between the count value C2U of the aforementioned high resolution counter 24 and the count value C2D of the high resolution counter 24 can also be expressed by a function of the comparison value TH. When a count value at the predetermined period T in which the counter 13 counts is set as CT, and a count value at the predetermined period T in which the high resolution counter 24 counts is set as cT, equation (1) as follows is established.

$$dC/cT = (CT - TH)/CT \qquad (1)$$

From equation (1), equation (2) as follows is derived.

$$TH = CT - (CT \times dC/cT) \qquad (2)$$

The converter circuit 28 calculates the estimated value EV of the comparison value TH from the above described count values CT, cT and the difference value dC corresponding to the predetermined period T. The converter circuit 28 stores the calculated estimated value EV in the estimated value register 22 as an estimated value of the comparison value TH which is inputted to the comparison value register 11. In other words, the converter circuit 28 which configures the inverse operation circuit determines timings of rise and fall of the waveform signal WS based on the count value which is counted by using the clock signal of the oscillation circuit 4. The converter circuit 28 performs an operation of estimating the estimated value of the input signal based on the timings of the rise and fall of the waveform signal WS. In other words, the converter circuit 28 outputs the estimated value of the comparison value TH by using a count value of the timing of the rise of the waveform signal WS, and a count value at the timing of the fall of the waveform signal WS.

Therefore, the comparison value TH which is inputted to the main circuit 2 is stored in the expected value register 21 as the expected value, and the estimated value EV of the comparison value which is obtained by performing an inverse operation from the waveform signal WS which is the output of the main circuit 2 by the converter circuit 28 is stored in the estimated value register 22. The comparison circuit 23 compares the comparison value TH of the expected value register 21 and the estimated value EV of the estimated value register 22 and determines whether the comparison value TH of the expected value register 21 and the estimated value EV of the estimated value register 22 coincide with each other.

In other words, the converter circuit 28 which configures the inverse operation circuit performs inverse operation and outputs an inverse operation result signal, at each predetermined period T, and the comparison circuit 23 compares the input signal and the inverse operation result signal at each predetermined period T, and outputs the abnormal signal AB as the predetermined signal when the input signal and the inverse operation result signal do not coincide with each other.

FIG. 4 illustrates changes of the respective count values and the respective signals in three periods T. In the first period T, a comparison value TH1 is given to the comparison value register 11, and the main circuit 2 outputs the waveform signal WS of a duty ratio corresponding to the comparison value TH1. In the falling edge capture register 26, "C2D11" is stored. In the rising edge capture register 25, "C2U21" is stored. In the expected value register 21, "TH1" is stored. The comparison circuit 23 does not output the abnormal signal AB because the estimated value "EV31" from the estimated value register 22 and the expected value "TH1" coincide with each other. The comparison circuit 23 outputs the abnormal signal AB at an end timing of the predetermined period T.

In the next period to the first period T, a comparison value TH2 is given to the comparison value register 11. However, due to noise or the like, the main circuit 2 does not output the waveform signal WS of a duty ratio corresponding to the comparison value TH2. Therefore, in the falling edge capture register 26, "C2D12" is stored. In the rising edge capture register 25, "C2U22" is stored. In the expected value register 21, "TH2" is stored. The comparison circuit 23 outputs, that is, asserts the abnormal signal AB because the comparison circuit 23 compares an expected value "EV32" from the estimated value register 22 and an expected value "TH2", and the estimated value "EV32" does not coincide with the expected value "TH2".

When the control circuit 5 receives the abnormal signal AB, the control circuit 5 executes a predetermined abnormality processing, in this case, output processing of an alarm signal AL. In the next period T, the comparison circuit 23 does not output the abnormal signal AB because the estimated value from the estimated value register 22 and the expected value "TH3" coincide with each other.

As above, according to the present embodiment, the functionally safe semiconductor device which is also capable of handling a common cause failure can be provided while the circuit scale is restrained from increasing.

In a case of a conventional semiconductor device of a DCLS configuration, the circuit scale of the redundancy circuit is also large when the circuit scale of the main body circuit is large, as a result of which, a chip size of the semiconductor device also becomes large. Further, when the circuit scale is large, power consumption increases, and cost is high.

Further, a conventional semiconductor device of a DCLS configuration cannot handle the common cause failure such as a case where the main circuit itself has a design error, or a case where a program that operates the main circuit has a bug.

In relation to this, according to the aforementioned embodiment, a method for detecting an abnormality is not of a configuration of a DCLS method, and therefore, the redundancy circuit does not have the same configuration as the main circuit. Consequently, even when the main circuit becomes large, the redundancy circuit does not become large. The redundancy circuit obtains a set value (or a specified value) which is inputted to the main circuit from the output signal of the main circuit, compares the inputted set value, and detects an abnormality. Therefore, the redundancy circuit can also handle a common cause failure.

Consequently, according to the aforementioned embodiment, the functionally safe semiconductor device which can deal with the common cause failure can be provided while increase in a circuit area is suppressed.

Second Embodiment

In the first embodiment, the main circuit of the semiconductor device is a circuit configured to output the PWM signal corresponding to the inputted set value, whereas in a second embodiment, the main circuit is a circuit configured to perform predetermined encoding to an inputted data signal.

(Configuration)

In the present embodiment, the same components as the components of the first embodiment are assigned with the identical reference signs, explanation of the components will be omitted, and different components will be described.

Figure 5:
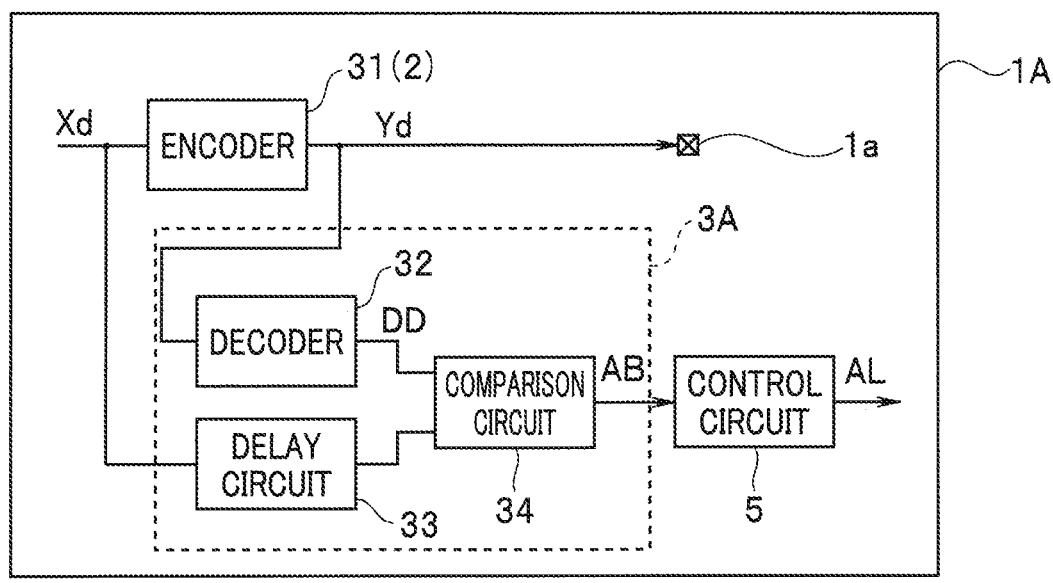
FIG. 5 is a block diagram of a semiconductor device according to a second embodiment.

FIG. 5 is a block diagram of a semiconductor device according to the present embodiment. A semiconductor device 1A includes an encoder 31 as the main circuit 2, a redundancy circuit 3A, and the control circuit 5. The encoder 31 is an operation circuit configured to perform predetermined encoding as a predetermined operation, to a digital signal Xd which is an input signal, and output as an output signal a digital signal Yd which is an encoded digital signal Xd.

The redundancy circuit 3A includes a decoder 32, a delay circuit 33, and a comparison circuit 34. The decoder 32 is a circuit configured to decode the digital signal Yd from the encoder 31, calculate the original digital signal Xd before being encoded by the encoder 31 and output the original digital signal Xd to the comparison circuit 34. The decoder 32 performs decoding, which is an inverse operation of encoding processing of the encoder 31, to the digital signal Yd which is the output signal of the encoder 31, and outputs a decode signal DD of the digital signal Yd.

In other words, the redundancy circuit 3A configures an inverse operation circuit configured to receive the digital signal Yd that is the output signal of the encoder 31 as an input, perform an inverse operation of a predetermined operation of the encoder 31 by using the digital signal Yd, and output an inverse operation result signal.

The delay circuit 33 is a timing adjustment circuit configured to delay the inputted digital signal Xd by a predetermined time Td to output the digital signal Xd to the comparison circuit 34. In other words, the delay circuit 33 configures a latch circuit configured to latch the digital signal Xd for a predetermined time period which is the input signal. The comparison circuit 34 compares two signals that are the input signal from the delay circuit 33 and the output signal from the decoder 32, and when the two signals do not coincide with each other, the comparison circuit 34 outputs the abnormal signal AB. The delay circuit 33 delays the digital signal Xd which is inputted to the encoder 31 by a time period after the digital signal Xd is inputted until the digital signal Xd is encoded in the encoder 31, the digital signal Yd is further decoded and the original digital signal Xd is outputted by the decoder 32.

In other words, the comparison circuit 34 compares the input signal and the inverse operation result signal, and outputs the abnormal signal AB as the predetermined signal when the input signal and the inverse operation result signal do not coincide with each other.

(Operation)

An operation of the aforementioned redundancy circuit will be described. The encoder 31 as the main circuit 2 performs predetermined encoding to the digital signal Xd which is the input signal, and the digital signal Yd is outputted from the output terminal 1a.

The decoder 32 of the redundancy circuit 3A performs an inverse operation of the encoder 31 to the digital signal Yd which is the output signal of the encoder 31 to output the decode signal DD. The comparison circuit 34 compares the two signals that are the digital signal Xd and the decode signal DD.

The comparison circuit 34 does not output the abnormal signal AB when the two signals that are the digital signal Xd and the decode signal DD coincide with each other. However, when the predetermined encoding is not correctly performed in the encoder 31 due to noise or the like, for example, the two signals that are the digital signal Xd and the decode signal DD do not coincide with each other. In that case, the comparison circuit 34 of the redundancy circuit 3A outputs, that is, asserts the abnormal signal AB, because the two signals do not coincide with each other.

As above, according to the embodiment described above, the functionally safe semiconductor device also capable of handling the common cause failure can be provided while the circuit scale is restrained from increasing.

In the respective embodiments described above, an example of the main circuit 2 is a PWM control circuit or an encoder, but it goes without saying that the example of the main circuit 2 may be a circuit with another function such as a communication circuit such as UART.

The aforementioned respective embodiments can also handle a common cause by noise or the like, and therefore is especially effective for semiconductor devices that are used in places with a lot of noise such as a vehicle, and a plant.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor device, comprising:
an operation circuit configured to perform a predetermined operation to an input signal input at each of plural predetermined periods, to output a PWM signal at each of the predetermined periods, and to output, at each of the predetermined periods, a timing signal indicating an end timing of its corresponding one of the predetermined periods, the input signal specifying a duty ratio of the PWM signal, the duty ratio being changeable at each of the predetermined periods in response to the input signal, and the PWM signal being generated by using a first clock signal;
an inverse operation circuit configured to (i) receive, as an input, the PWM signal output at each of the predetermined periods, (ii) detect rise and fall timings of the PWM signal by using a second clock signal of a higher frequency than a frequency of the first clock signal, (iii) obtain, as an inverse operation result signal, an estimated value of the input signal based on a first timing corresponding to the detected rise timing and a second timing corresponding to the detected fall timing by performing an inverse operation of the predetermined operation, and (iv) output the inverse operation result signal at each of the predetermined periods; and
a comparison circuit configured to compare, at each of the predetermined periods, the input signal and the inverse operation result signal in response to the timing signal, and output, at each of the predetermined periods, a predetermined signal when the input signal and the inverse operation result signal do not coincide with each other.

2. The semiconductor device according to claim 1, further comprising:
a clock circuit configured to output the second clock signal,
wherein the inverse operation circuit determines the rise and fall timings of the PWM signal based on a count value which is counted by using the second clock signal.

3. The semiconductor device according to claim 2, wherein:
the operation circuit receives a threshold signal as the input signal, and outputs the PWM signal based on the threshold signal, and
the inverse operation circuit outputs the estimated value of the threshold signal by using the count value at the rise timing of the PWM signal, and the count value at the fall timing of the PWM signal.

4. The semiconductor device according to claim 1, wherein the input signal is a comparison value signal that specifies the duty ratio of the PWM signal for motor drive.

* * * * *